(12) United States Patent
Munteanu et al.

(10) Patent No.: US 8,969,719 B2
(45) Date of Patent: Mar. 3, 2015

(54) CHALCOGENIDE-BASED PHOTOVOLTAIC DEVICES AND METHODS OF MANUFACTURING THE SAME

(75) Inventors: Mariana Rodica Munteanu, Santa Clara, CA (US); Erol Girt, Burnaby (CA)

(73) Assignee: Zetta Research and Development LLC—AQT Series, Wilmington, DE (US)

( * ) Notice: Subject to any disclaimer, the term of this patent is extended or adjusted under 35 U.S.C. 154(b) by 983 days.

(21) Appl. No.: 12/641,893

(22) Filed: Dec. 18, 2009

(65) Prior Publication Data

US 2011/0011460 A1 Jan. 20, 2011

Related U.S. Application Data

(60) Provisional application No. 61/203,256, filed on Dec. 19, 2008.

(51) Int. Cl.
| | | |
|---|---|---|
| *H01L 31/00* | (2006.01) | |
| *H01L 31/032* | (2006.01) | |
| *C23C 14/00* | (2006.01) | |
| *C23C 14/06* | (2006.01) | |
| *C23C 14/34* | (2006.01) | |
| *H01L 31/0749* | (2012.01) | |

(52) U.S. Cl.
CPC ........ *H01L 31/0322* (2013.01); *C23C 14/0057* (2013.01); *C23C 14/0623* (2013.01); *C23C 14/3492* (2013.01); *H01L 31/0749* (2013.01); *Y02E 10/541* (2013.01)
USPC ............ 136/265; 136/260; 136/262; 136/264

(58) Field of Classification Search
USPC .................. 136/252, 260, 262, 264, 265, 243
See application file for complete search history.

(56) References Cited

U.S. PATENT DOCUMENTS 6,310,281 B1 * 10/2001 Wendt et al. .................. 136/256

FOREIGN PATENT DOCUMENTS

| JP | 10-074967 A | 3/1998 |
|---|---|---|
| JP | 2000-332273 A | 11/2000 |
| JP | 2004-047917 A | 2/2004 |

(Continued)

OTHER PUBLICATIONS

Virtuani et al "Influence of Cu content on electronic transport and shunting behavior of Cu(In,Ga)Se2 solar cells", Journal of Applied Physics, vol. 99, Issue 1, pp. 014906-1-014906-11, pulished online Jan. 13, 2006.*

(Continued)

*Primary Examiner* — Alexander Kollias
(74) *Attorney, Agent, or Firm* — Mattingly & Malur, PC

(57) ABSTRACT

In one example embodiment, a method includes sputtering one or more absorber layers over a substrate. In a particular embodiment, the substrate is pre-heated to a substrate temperature of at least approximately 300 degrees Celsius prior to the sputtering and during the sputtering of each of one or more of the absorber layers, and the sputtering of at least one of the absorber layers is performed in a sputtering atmosphere having a pressure of at least 0.5 Pascals. Additionally, in a particular embodiment, the sputtering of at least one of the absorber layers comprises sputtering from a sputter target that comprises a chalcogenide alloy that comprises copper (Cu) and one or more of sulfur (S), selenium (Se), or tellurium (Te).

16 Claims, 12 Drawing Sheets

(56) References Cited

FOREIGN PATENT DOCUMENTS

JP       2004-296749 A    10/2004
JP       2006-196771 A     7/2006

OTHER PUBLICATIONS

Abou-Ras et al, "Interfacial layer formations between Cu(In,Ga)Se2 and InxSy layers", Journal of applied Physics, vol. 98, Issue 12, pp. 123512-1-123512-7, published onlione Dec. 27, 2005.*

Wei et al "Improvement in efficiency of solar cell by removing Cu2-xSe from CIGS film surface", Chinese Physiscs, vol. 15, No. 4 pp. 878-881, (2006).*

Samili et al "Characterization of CuIn1—xAlxS2 thin films prepared by thermal evaporation", Materials Science and Engineering: c, vol. 28, Issues 5-6, pp. 954-958, published on lines Oct. 13, 2007.*

International Search Report and Written Opinion for PCT/US2009/068927, Aug. 17, 2010.

* cited by examiner

| DR [nm/s] | d [cm] | $V_{Bias}$ | $p_{tot}$ [mTorr] | $p_{tot}$ [Pa] | $T_{sub}$ [C] |
|---|---|---|---|---|---|
|  |  |  | > 4 | > 0.5 | > 300 |
|  | < 5 |  | > 5 | > 0.7 | > 300 |
|  | < 3 |  | > 7 | > 0.9 | > 300 |
|  | < 1.5 |  | > 1 | >1.3 | > 300 |
| > 5 |  |  | > 5 | > 0.7 | > 300 |
| > 5 | < 5 |  | > 7 | > 0.9 | > 300 |
| > 5 | < 3 |  | > 10 | >1.3 | > 300 |
| > 5 | < 1.5 |  | > 12 | > 1.7 | > 300 |
| > 10 | < 5 |  | > 10 | >1.3 | > 300 |
| > 10 | < 3 |  | > 12 | > 1.7 | > 300 |
| > 10 | < 1.5 |  | > 16 | > 2 | > 300 |
| > 5 | < 3 | < -150 | > 12 | > 1.7 | > 300 |
| > 5 | < 3 | < -300 | > 16 | > 2 | > 300 |

| Examples of source materials used to sputter deposit proposed absorber composition profile |||
|---|---|---|
| Layer 110n where $n = i + j + k$ |||
| Layer 110i ($1 \leq i \leq 100$) | Layer 110j ($0 \leq j \leq 100$) | Layer 110k ($0 \leq k \leq 100$) |
| $In_2(S_{1-d}Se_d)_3$, $0 \leq d \leq 1$ | $Cu_{1-x-y-z}In_xGa_yAl_zS_{1-d}Se_d$, $0 \leq x \leq 1$, $0 \leq y \leq 1$, $0 \leq z \leq 0.5$, $x+y+z \leq 1$, $0 \leq d \leq 1$ | $In_2(S_{1-d}Se_d)_3$, $0 \leq d \leq 1$ |
| $(In_{1-x-y}Ga_xAl_y)_2(S_{1-d}Se_d)_3$, $0 \leq x \leq 1$, $0 \leq y \leq 0.5$, $x+y \leq 1$, $0 \leq d \leq 1$ | $Cu_{1-x-y-z}In_xGa_yAl_z$, $0 \leq x \leq 1$, $0 \leq y \leq 1$, $0 \leq z \leq 0.5$, $x+y+z \leq 1$, sputtered in the presence of $H_2S$ | $(In_{1-x-y}Ga_xAl_y)_2(S_{1-d}Se_d)_3$, $0 \leq x \leq 1$, $0 \leq y \leq 0.5$, $x+y \leq 1$, $0 \leq d \leq 1$ |
| $In$, sputtered in the presence of $H_2S$ | $Cu_{1-x}In_x$, $0 \leq x \leq 1$, sputtered in the presence of $H_2Se$ | $In$, sputtered in the presence of $H_2S$ |
| $Cu_{1-x}In_x$, $0 \leq x \leq 1$, sputtered in the presence of $H_2S$ | $Cu_{1-x-y-z}In_xGa_yAl_z$, $0 \leq x \leq 1$, $0 \leq y \leq 1$, $0 \leq z \leq 0.5$, $x+y+z \leq 1$, sputtered in the presence of $H_2Se$ | $Cu_{1-x}In_x$, $0 \leq x \leq 1$, sputtered in the presence of $H_2S$ |
| $Cu_{1-x-y-z}In_xGa_yAl_zS_{1-d}Se_d$, $0 \leq x \leq 1$, $0 \leq y \leq 1$, $0 \leq z \leq 0.5$, $x+y+z \leq 1$, $0 \leq d \leq 1$ | $Cu_{1-x}In_x$, $0 \leq x \leq 1$, sputtered in the presence of $H_2S$ and $H_2Se$ | $Cu_{1-x-y-z}In_xGa_yAl_zS_{1-d}Se_d$, $0 \leq x \leq 1$, $0 \leq y \leq 1$, $0 \leq z \leq 0.5$, $x+y+z \leq 1$, $0 \leq d \leq 1$ |
| $Cu_{1-x-y-z}In_xGa_yAl_z$, $0 \leq x \leq 1$, $0 \leq y \leq 1$, $0 \leq z \leq 0.5$, $x+y+z \leq 1$, sputtered in the presence of $H_2S$ | $Cu_{1-x-y-z}In_xGa_yAl_z$, $0 \leq x \leq 1$, $0 \leq y \leq 1$, $0 \leq z \leq 0.5$, $x+y+z \leq 1$, sputtered in the presence of $H_2S$ and $H_2Se$ | $Cu_{1-x-y-z}In_xGa_yAl_z$, $0 \leq x \leq 1$, $0 \leq y \leq 1$, $0 \leq z \leq 0.5$, $x+y+z \leq 1$, sputtered in the presence of $H_2Se$ |
| $In$, sputtered in the presence of $H_2Se$ | $Cu_{1-x-y-z-i-j}In_xGa_yAl_zZn_iNa_j$, $0 \leq x \leq 1$, $0 \leq y \leq 0.5$, $0 \leq z \leq 0.5$, $0 \leq i \leq 0.5$, $0 \leq j \leq 0.04$, $x+y+z+i+j \leq 1$, sputtered in the presence of $H_2S$ and $H_2Se$ | $In$, sputtered in the presence of $H_2Se$ |

*FIG. 6A*

| | |
|---|---|
| $Cu_{1-x}In_w$, $0 \leq x \leq 1$, sputtered in the presence of $H_2Se$ | $Cu_{1-x-y-z}In_xGa_yAl_zZn_zNa_i$, $0 \leq x \leq 1$, $0 \leq y \leq 0.5$, $0 \leq z \leq 0.5$, $0 \leq i \leq 0.04$, sputtered in the presence of $H_2S$ and $H_2Se$ |
| $Cu_{1-x-y-z}In_xGa_yAl_z$, $0 \leq x \leq 1$, $0 \leq y \leq 1$, $0 \leq z \leq 0.5$, $x+y+z \leq 1$, sputtered in the presence of $H_2Se$ | $Cu_{1-x}In_w$, $0 \leq x \leq 1$, sputtered in the presence of $H_2Se$ |
| In sputtered in the presence of $H_2S$ and $H_2Se$ | $Cu_{1-x-y-z}In_xGa_yAl_z$, $0 \leq x \leq 1$, $0 \leq y \leq 1$, $0 \leq z \leq 0.5$, $x+y+z \leq 1$, sputtered in the presence of $H_2Se$ |
| $Cu_{1-x}In_w$, $0 \leq x \leq 1$, sputtered in the presence of $H_2S$ and $H_2Se$ | In sputtered in the presence of $H_2S$ and $H_2Se$ |
| $Cu_{1-x-y-z}In_xGa_yAl_z$, $0 \leq x \leq 1$, $0 \leq y \leq 1$, $0 \leq z \leq 0.5$, $x+y+z \leq 1$, sputtered in the presence of $H_2S$ and $H_2Se$ | $Cu_{1-x}In_w$, $0 \leq x \leq 1$, sputtered in the presence of $H_2S$ and $H_2Se$ |
| $(In_{1-x-y-z-i}Ga_xAl_yZn_zNa_i)_2(S_{1-d-f}Se_dTe_f)_3$, $0 \leq x \leq 1$, $0 \leq y \leq 0.5$, $0 \leq z \leq 0.5$, $0 \leq i \leq 0.04$, $x+y+z+i \leq 1$, $0 \leq d \leq 1$, $0 \leq f \leq 0.5$, $d+f \leq 1$, | $Cu_{1-x-y-z}In_xGa_yAl_z$, $0 \leq x \leq 1$, $0 \leq y \leq 1$, $0 \leq z \leq 0.5$, $x+y+z \leq 1$, sputtered in the presence of $H_2S$ and $H_2Se$ |
| $(In_{1-x-y-z-i}Ga_xAl_yZn_zNa_i)_2(S_{1-d-f}Se_dTe_f)_3$, $0 \leq x \leq 1$, $0 \leq y \leq 0.5$, $0 \leq z \leq 0.5$, $0 \leq i \leq 0.04$, $x+y+z+i \leq 1$, $0 \leq d \leq 1$, $0 \leq f \leq 0.5$, $d+f \leq 1$, sputtered in the presence of H2S | $(In_{1-x-y-z-i}Ga_xAl_yZn_zNa_i)_2(S_{1-d-f}Se_dTe_f)_3$, $0 \leq x \leq 1$, $0 \leq y \leq 0.5$, $0 \leq z \leq 0.5$, $0 \leq i \leq 0.04$, $x+y+z+i \leq 1$, $0 \leq d \leq 1$, $0 \leq f \leq 0.5$, $d+f \leq 1$, |
| $Cu_{1-x-y-z-i}In_xGa_yAl_zZn_iNa_j$, $0 \leq x \leq 1$, $0 \leq y \leq 0.5$, $0 \leq z \leq 0.5$, $0 \leq j \leq 0.04$, $x+y+z+i+j \leq 1$, sputtered in the presence of $H_2S$ and $H_2Se$ | $(In_{1-x-y-z-i}Ga_xAl_yZn_zNa_i)_2(S_{1-d-f}Se_dTe_f)_3$, $0 \leq x \leq 1$, $0 \leq y \leq 0.5$, $0 \leq z \leq 0.5$, $0 \leq i \leq 0.04$, $x+y+z+i \leq 1$, $0 \leq d \leq 1$, $0 \leq f \leq 0.5$, $d+f \leq 1$, sputtered in the presence of H2S |
| | $Cu_{1-x-y-z-i}In_xGa_yAl_zZn_iNa_j$, $0 \leq x \leq 1$, $0 \leq y \leq 0.5$, $0 \leq z \leq 0.5$, $0 \leq j \leq 0.04$, $x+y+z+i+j \leq 1$, sputtered in the presence of $H_2S$ and $H_2Se$ |

*FIG. 6B*

| Examples of source materials used to sputter deposit buffer layer Layer 130m ($1 \leq m \leq 100$) |
|---|
| In, sputtered in the presence of at least one these two gasses $H_2S$ and $H_2Se$ |
| $In_{1-x}Zn_x$, $0 \leq x \leq 1$, sputtered in the presence of at least one these two gasses $H_2S$ and $H_2Se$ |
| $In_{1-x}Zn_xCd_y$, $0 \leq x \leq 1$, $0 \leq y \leq 1$, $x+y \leq 1$, sputtered in the presence of at least one these two gasses $H_2S$ and $H_2Se$ |
| $(In_{1-x-y-z-i-j}Ga_xAl_yCd_zZn_iSn_j)_{1-\alpha}(S_{1-d}Se_d)_\alpha$, $0 \leq x \leq 1$, $0 \leq y \leq 1$, $0 \leq z \leq 1$, $0 \leq i \leq 1$, $0 \leq j \leq 1$, $x+y+z+i+j \leq 1$, $0 \leq d \leq 1$, $0.2 \leq \alpha \leq 0.8$ |
| $(In_{1-x-y-z-i-j}Ga_xAl_yCd_zZn_iSn_j)_{1-\alpha}(S_{1-d}Se_d)_\alpha$, $0 \leq x \leq 1$, $0 \leq y \leq 1$, $0 \leq z \leq 1$, $0 \leq i \leq 1$, $0 \leq j \leq 1$, $x+y+z+i+j \leq 1$, $0 \leq d \leq 1$, $0.2 \leq \alpha \leq 0.8$, sputtered in the presence of at least one these two gasses $H_2S$ and $H_2Se$ |
| $In_{1-x-y-z-i}Ga_xCd_yZn_zNa_i$, $0 \leq x \leq 1$, $0 \leq y \leq 0.5$, $0 \leq z \leq 0.5$, $0 \leq i \leq 0.04$, $x+y+z+i \leq 1$, sputtered in the presence of at least one of these two gasses $H_2S$ and H2Se |
| $(In_{1-x-y-z-i}Ga_xCd_yZn_zNa_i)_{1-\alpha}(S_{1-d-f}Se_dTe_f)_\alpha$, $0 \leq x \leq 1$, $0 \leq y \leq 0.5$, $0 \leq z \leq 0.5$, $0 \leq i \leq 0.04$, $x+y+z+i \leq 1$, $0 \leq d \leq 1$, $0 \leq f \leq 0.5$, $d+f \leq 1$, $0.2 \leq a \leq 0.8$ |
| $(In_{1-x-y-z-i}Ga_xCd_yZn_zNa_i)_{1-\alpha}(S_{1-d-f}Se_dTe_f)_\alpha$, $0 \leq x \leq 1$, $0 \leq y \leq 0.5$, $0 \leq z \leq 0.5$, $0 \leq i \leq 0.04$, $x+y+z+i \leq 1$, $0 \leq d \leq 1$, $0 \leq f \leq 0.5$, $d+f \leq 1$, $0.2 \leq a \leq 0.8$, sputtered in the presence of at least one of these two gasses $H_2S$ and H2Se |

*FIG. 7*

CHALCOGENIDE-BASED PHOTOVOLTAIC DEVICES AND METHODS OF MANUFACTURING THE SAME

RELATED APPLICATIONS

This application claims the benefit, under 35 U.S.C. §119 (e), of U.S. Provisional Patent Application No. 61/203,256, entitled SPUTTER PROCESS FOR FABRICATION CuIn BASED SOLAR CELLS, filed 19 Dec. 2008, and hereby incorporated by reference herein.

TECHNICAL FIELD

The present disclosure generally relates to the manufacturing of photovoltaic devices, and more particularly, to the use of sputtering, and more particularly magnetron sputtering, in forming absorber and/or buffer layers for photovoltaic devices.

BACKGROUND

P-n junction based photovoltaic cells are commonly used as solar cells. Generally, p-n junction based photovoltaic cells include a layer of an n-type semiconductor in direct contact with a layer of a p-type semiconductor. By way of background, when a p-type semiconductor is positioned in intimate contact with an n-type semiconductor a diffusion of electrons occurs from the region of high electron concentration (the n-type side of the junction) into the region of low electron concentration (the p-type side of the junction). However, the diffusion of charge carriers (electrons) does not happen indefinitely, as an opposing electric field is created by this charge imbalance. The electric field established across the p-n junction induces a separation of charge carriers that are created as result of photon absorption.

Chalcogenide (both single and mixed) semiconductors have optical band gaps well within the terrestrial solar spectrum, and hence, can be used as photon absorbers in thin film based photovoltaic cells, such as solar cells, to generate electron-hole pairs and convert light energy to usable electrical energy. More specifically, semiconducting chalcogenide films are typically used as the absorber layers in such devices. A chalcogenide is a chemical compound consisting of at least one chalcogen ion (group 16 (VIA) elements in the periodic table, e.g., sulfur (S), selenium (Se), and tellurium (Te)) and at least one more electropositive element. As those of skill in the art will appreciate, references to chalcogenides are generally made in reference to sulfides, selenides, and tellurides. Thin film based solar cell devices may utilize these chalcogenide semiconductor materials as the absorber layer(s) as is or, alternately, in the form of an alloy with other elements or even compounds such as oxides, nitrides and carbides, among others. Physical vapor deposition (PVD) based processes, and particularly sputter based deposition processes, have conventionally been utilized for high volume manufacturing of such thin film layers with high throughput and yield.

BRIEF DESCRIPTION OF THE DRAWINGS

FIGS. 6A and 6B illustrate top and bottom portions, respectively, of a table showing example sputtering sources and parameters suitable for use in forming an absorber layer.

FIG. 7 illustrates a table showing example sputtering sources and parameters suitable for use in forming a buffer layer.

DESCRIPTION OF EXAMPLE EMBODIMENTS

Particular embodiments of the present disclosure relate to the use of sputtering, and more particularly magnetron sputtering, in forming absorber and/or buffer layers for photovoltaic devices (hereinafter also referred to as "photovoltaic cells," "solar cells," or "solar devices"). In particular embodiments, magnetron sputtering is used in forming chalcogenide absorber or buffer layers. Particular embodiments contemplate reducing the energies of the particles (atoms) ejected from a sputter target during the sputter (sputtering) process to improve the electronic quality of the deposited absorber or buffer layers. In particular embodiments, energy reduction may be achieved during the sputtering process via one or more of: reducing the discharge voltage, increasing the pressure of the sputtering gas atmosphere, and increasing the distance between the source and substrate during the sputtering process. Various particular embodiments may utilize both elemental and compound sputter sources (targets). Particular embodiments may also utilize a reactive sputter process in the presence of at least one of $H_2S$ and $H_2Se$ for depositing CIGS, and particularly CuIn—(S,Se,Te) (e.g., CuIn(S,Se,Te)$_2$), based absorber layers (hereinafter, CuIn—Se, CuIn—S, CuIn—Te, or suitable combinations thereof may collectively be referred to as CuIn-(Se,S,Te) where appropriate). Hereinafter, reference to a layer may encompass a film, and vice versa, where appropriate. Additionally, reference to a layer may also encompass one or more layers, where appropriate.

Copper indium gallium diselenide (e.g., $Cu(In_{1-x}Ga_x)Se_2$, where x is less than or equal to approximately 0.7), copper indium gallium selenide sulfide (e.g., $Cu(In_{1-x}Ga_x)(Se_{1-y}S_y)_2$, where x is less than or equal to approximately 0.7 and y is less than or equal to approximately 0.99), and copper indium gallium disulfide (e.g., $Cu(In_{1-x}Ga_x)S_2$, where x is less than or equal to approximately 0.7), each of which is commonly referred to as a "CIGS" material, have been successfully used in the fabrication of thin film absorbers in photovoltaic cells largely due to their relatively large absorption coefficients. In fact, photovoltaic cells having photovoltaic efficiencies greater or equal than approximately 20% have been manufactured using copper indium gallium diselenide absorber layers. Efforts to minimize the defect density in the absorber layer(s) (hereinafter referred to individually or collectively as "absorber layer" or "absorber") have enabled the manufacture of high quality CIGS thin film based photovoltaic cells.

Figure 1A:
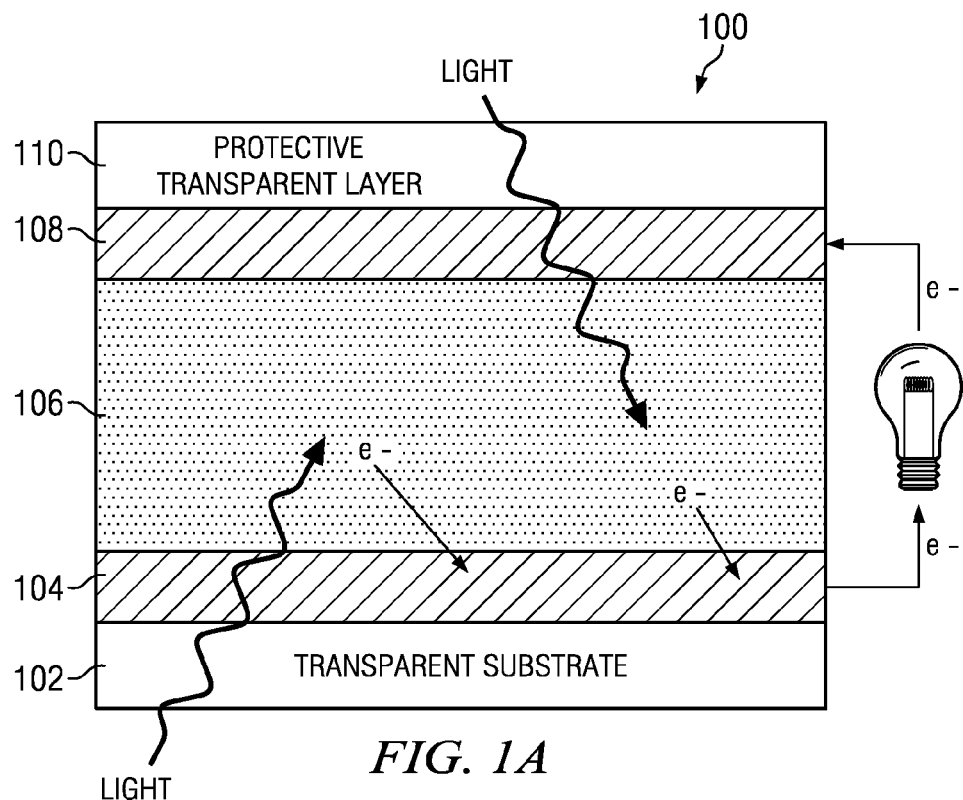
FIGS. 1A-1D illustrate diagrammatic cross-sectional side views of example solar cell configurations.
Figure 1B:
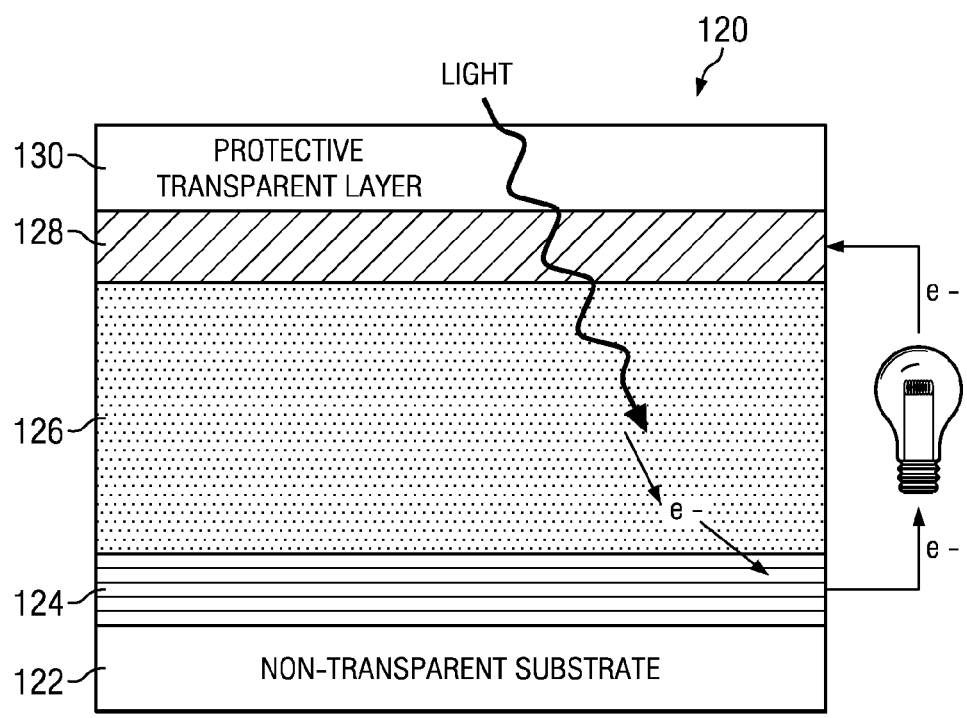
Figure 1C:
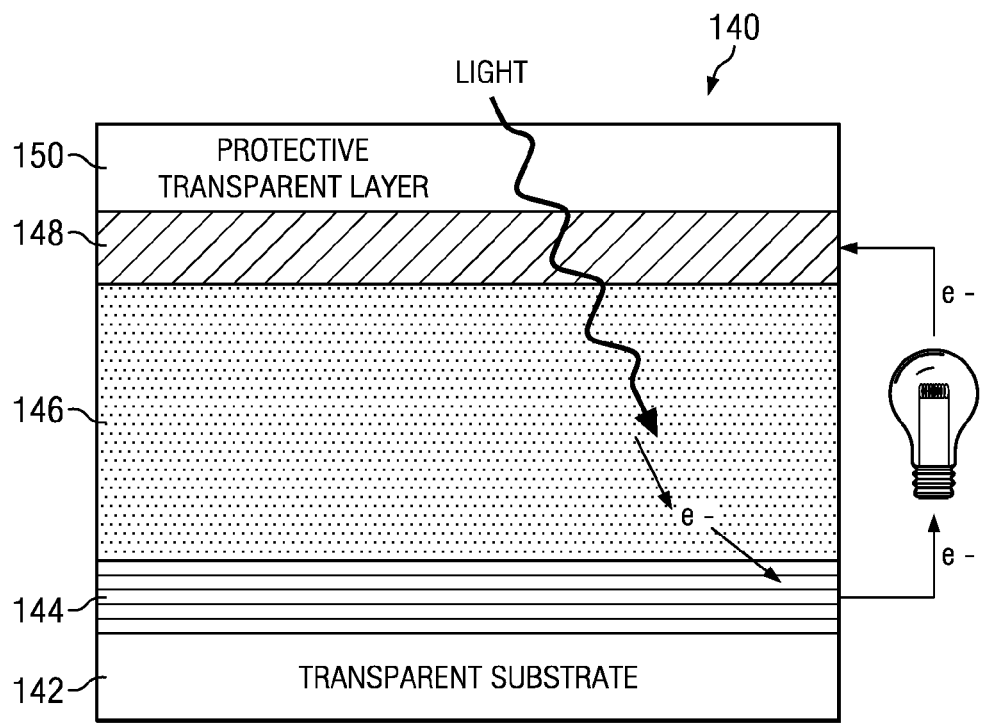
Figure 1D:
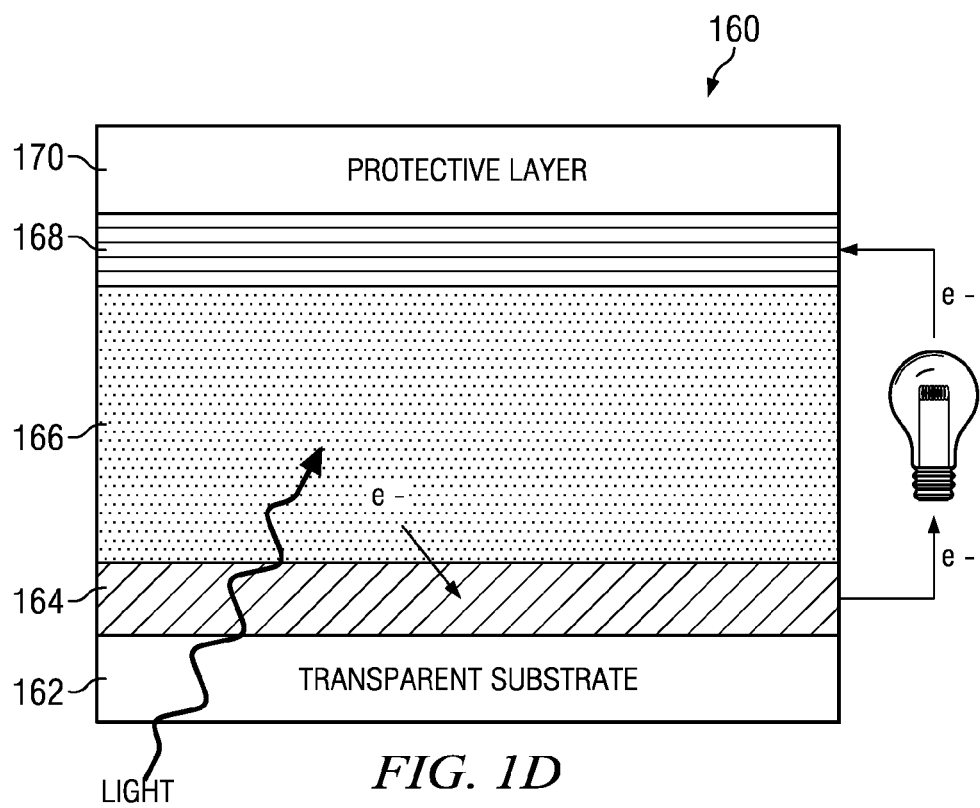

FIGS. 1A-1D illustrate diagrammatic cross-sectional side views of example solar cell configurations. In particular, FIG. 1A illustrates an example solar cell 100 that includes, in overlying sequence, a transparent glass substrate 102, a transparent conductive layer 104, a conversion layer 106, a transparent conductive layer 108, and a protective transparent layer 110. In this example solar cell design, light can enter the solar cell 100 from the top (through the protective transparent layer 110) or from the bottom (through the transparent substrate 102). FIG. 1B illustrates another example solar cell 120 that includes, in overlying sequence, a non-transparent substrate (e.g., a metal, plastic, ceramic, or other suitable non-transparent substrate) 122, a conductive layer 124, a conversion layer 126, a transparent conductive layer 128, and a protective transparent layer 130. In this example solar cell design, light can enter the solar cell 120 from the top (through the protective transparent layer 130). FIG. 1C illustrates another example solar cell 140 that includes, in overlying sequence, a transparent substrate (e.g., a glass, plastic, or other suitable transparent substrate) 142, a conductive layer 144, a conversion layer 146, a transparent conductive layer 148, and a protective transparent layer 150. In this example solar cell design, light can enter the solar cell 140 from the top (through protective transparent layer 150). FIG. 1D illustrates yet another example solar cell 160 that includes, in overlying sequence, a transparent substrate (e.g., a glass, plastic, or other suitable transparent substrate) 162, a transparent conductive layer 164, a conversion layer 166, a conductive layer 168, and a protective layer 170. In this example solar cell design, light can enter the solar cell 160 from the bottom (through the transparent substrate 162).

In order to achieve charge separation (the separation of electron-hole pairs) during operation of the resultant photovoltaic devices, each of the conversion layers 106, 126, 146, and 166 are comprised of at least one n-type semiconductor material and at least one p-type semiconductor material. In particular embodiments, each of the conversion layers 106, 126, 146, and 166 are comprised of at least one or more absorber layers and one or more buffer layers having opposite doping as the absorber layers. By way of example, if the absorber layer is formed from a p-type semiconductor, the buffer layer is formed from an n-type semiconductor. On the other hand, if the absorber layer is formed from an n-type semiconductor, the buffer layer is formed from a p-type semiconductor. More particular embodiments of example conversion layers suitable for use as one or more of conversion layers 106, 126, 146, or 166 will be described later in the present disclosure.

In particular embodiments, each of the transparent conductive layers 104, 108, 128, 148, or 164 is comprised of at least one oxide layer. By way of example and not by way of limitation, the oxide layer forming the transparent conductive layer may include one or more layers each formed of one or more of: titanium oxide (e.g., one or more of TiO, $TiO_2$, $Ti_2O_3$, or $Ti_3O_5$), aluminum oxide (e.g., $Al_2O_3$), cobalt oxide (e.g., one or more of CoO, $Co_2O_3$, or $Co_3O_4$), silicon oxide (e.g., $SiO_2$), tin oxide (e.g., one or more of SnO or $SnO_2$), zinc oxide (e.g., ZnO), molybdenum oxide (e.g., one or more of Mo, $MoO_2$, or $MoO_3$), tantalum oxide (e.g., one or more of TaO, $TaO_2$, or $Ta_2O_5$), tungsten oxide (e.g., one or more of $WO_2$ or $WO_3$), indium oxide (e.g., one or more of InO or $In_2O_3$), magnesium oxide (e.g., MgO), bismuth oxide (e.g., $Bi_2O_3$), copper oxide (e.g., CuO), vanadium oxide (e.g., one or more of VO, $VO_2$, $V_2O_3$, $V_2O_5$, or $V_3O_5$), chromium oxide (e.g., one or more of $CrO_2$, $CrO_3$, $Cr_2O_3$, or $Cr_3O_4$), zirconium oxide (e.g., $ZrO_2$), or yttrium oxide (e.g., $Y_2O_3$). Additionally, in various embodiments, the oxide layer may be doped with one or more of a variety of suitable elements or compounds. In one particular embodiment, each of the transparent conductive layers 104, 108, 128, 148, or 164 may be comprised of ZnO doped with at least one of: aluminum oxide, titanium oxide, zirconium oxide, vanadium oxide, or tin oxide. In another particular embodiment, each of the transparent conductive layers 104, 108, 128, 148, or 164 may be comprised of indium oxide doped with at least one of: aluminum oxide, titanium oxide, zirconium oxide, vanadium oxide, or tin oxide. In another particular embodiment, each of the transparent conductive layers 104, 108, 128, 148, or 164 may be a multi-layer structure comprised of at least a first layer formed from at least one of: zinc oxide, aluminum oxide, titanium oxide, zirconium oxide, vanadium oxide, or tin oxide; and a second layer comprised of zinc oxide doped with at least one of: aluminum oxide, titanium oxide, zirconium oxide, vanadium oxide, or tin oxide. In another particular embodiment, each of the transparent conductive layers 104, 108, 128, 148, or 164 may be a multi-layer structure comprised of at least a first layer formed from at least one of: zinc oxide, aluminum oxide, titanium oxide, zirconium oxide, vanadium oxide, or tin oxide; and a second layer comprised of indium oxide doped with at least one of: aluminum oxide, titanium oxide, zirconium oxide, vanadium oxide, or tin oxide.

In particular embodiments, each of the conductive layers 124, 144, or 168 is comprised of at least one metal layer. By way of example and not by way of limitation, each of conductive layers 124, 144, or 168 may be formed of one or more layers each individually or collectively containing at least one of: aluminum (Al), titanium (Ti), vanadium (V), chromium (Cr), manganese (Mn), iron (Fe), cobalt (Co), nickel (Ni), copper (Cu), zirconium (Zr), niobium (Nb), molybdenum (Mo), ruthenium (Ru), rhodium (Rh), palladium (Pd), platinum (Pt), silver (Ag), hafnium (Hf), tantalum (Ta), tungsten (W), rhenium (Re), iridium (Ir), or gold (Au). In one particular embodiment, each of conductive layers 124, 144, or 168 may be formed of one or more layers each individually or collectively containing at least one of: Al, Ti, V, Cr, Mn, Fe, Co, Ni, Cu, Zr, Nb, Mo, Ru, Rh, Pd, Pt, Ag, Hf, Ta, W, Re, Ir, or Au; and at least one of: boron (B), carbon (C), nitrogen (N), lithium (Li), sodium (Na), silicon (Si), phosphorus (P), potassium (K), cesium (Cs), rubidium (Rb), sulfur (S), selenium (Se), tellurium (Te), mercury (Hg), lead (Pb), bismuth (Bi), tin (Sn), antimony (Sb), or germanium (Ge). In another particular embodiment, each of conductive layers 124, 144, or 168 may be formed of a Mo-based layer that contains Mo and at least one of: B, C, N, Na, Al, Si, P, S, K, Ti, V, Cr, Mn, Fe, Co, Ni, Cu, Zn, Ga, Ge, Se, Rb, Zr, Nb, Mo, Ru, Rh, Pd, Ag, Cs, Hf, Ta, W, Re, Ir, Pt, Au, Hg, Pb, or Bi. In another particular embodiment, each of conductive layers 124, 144, or 168 may be formed of a multi-layer structure comprised of an amorphous layer, a face-centered cubic (fcc) or hexagonal close-packed (hcp) interlayer, and a Mo-based layer. In such an embodiment, the amorphous layer may be comprised of at least one of: CrTi, CoTa, CrTa, CoW, or glass; the fcc or hcp interlayer may be comprised of at least one of: Al, Ni, Cu, Ru, Rh, Pd, Ag, Ir, Pt, Au, or Pb; and the Mo-based layer may be comprised of at least one of Mo and at least one of: B, C, N, Na, Al, Si, P, S, K, Ti, V, Cr, Mn, Fe, Co, Ni, Cu, Zn, Ga, Ge, Se, Rb, Zr, Nb, Mo, Ru, Rh, Pd, Ag, Cs, Hf, Ta, W, Re, Ir, Pt, Au, Hg, Pb, or Bi.

In particular embodiments, magnetron sputtering may be used to deposit each of the conversion layers 106, 126, 146, or 166, each of the transparent conductive layers 104, 108, 128, 148, or 164, as well as each of the conductive layers 124, 144, or 168. Magnetron sputtering is an established technique used for the deposition of metallic layers in, for example, magnetic hard drives, microelectronics, and in the deposition of intrinsic and conductive oxide layers in the semiconductor and solar cell industries. In magnetron sputtering, the sputtering source (target) is a magnetron that utilizes strong electric and magnetic fields to trap electrons close to the surface of the magnetron. These trapped electrons follow helical paths around the magnetic field lines undergoing more ionizing collisions with gaseous neutrals near the target surface than would otherwise occur. As a result, the plasma may be sustained at a lower sputtering atmosphere pressure. Additionally, higher deposition rates may also be achieved.

While conventional magnetron sputtering techniques have enabled high deposition rates and accurate control of the thickness and composition of certain deposited films over a large area, magnetron sputtering has rarely been used for depositing absorber and buffer semiconductor layers used in solar cells. By way of background, during a conventional sputtering process, high energy particles including positive ions, negative ions, and neutrals may be created in the plasma. These particles may strike the substrate producing defects in the deposited film structure. These defects act as recombination centers for electron-hole pairs that are created by incident light photons. Such recombination centers lower the light conversation efficiency of the absorbers in photovoltaic cells diminishing the output of the cells.

Figures 2, 3:
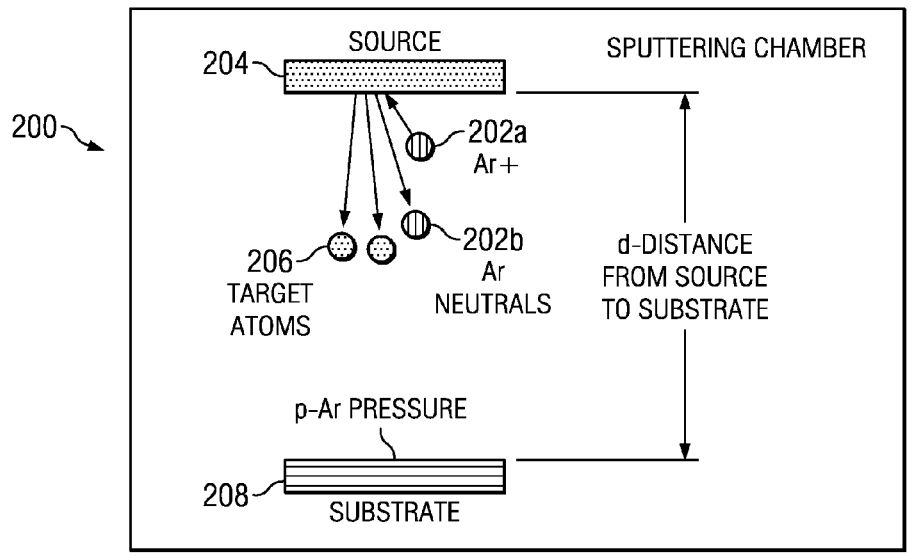
FIG. 2 illustrates an example sputtering chamber in which an example sputtering process is performed.
FIG. 3 shows a table that includes example sets of parameters for sputtering absorber layers.

FIG. 2 illustrates an example sputtering chamber 200 in which an example sputtering process is performed. In particular embodiments, the sputtering chamber 200 may be used for magnetron sputtering. In the illustrated example, argon (Ar) (positive) ions 202a strike the source (sputtering target, magnetron) 204 resulting in the ejection of target atoms 206 and electrons. The target atoms are then deposited as a thin film on substrate 208. Ejected electrons stay trapped close to the surface of the magnetron due to the presence of the magnetic field. The kinetic energy, $E_k$(atoms), and angle, α, at which the ejected target atoms 206 land on the substrate 208 (or on the thin film formed on the substrate by the target atoms 206 or previously deposited atoms) depend at least in part on the pressure, $p_{Ar}$, of the sputtering atmosphere (e.g., the pressure of the Ar) in sputtering chamber 200. More particularly, if $p_{Ar}$ is high, the subsequently ejected target atoms 206 undergo a greater number of collisions with positive Ar ions 202a and so called "Ar neutrals" (having neutral electromagnetic charge) 202b as the ejected target atoms 206 travel from source 204 to substrate 208 resulting in a reduction of the kinetic energy $E_k$(atoms) of the target atoms 206 and an increase of the incidence angle a of the ejected target atoms 206. Ar ions 202a that strike the source 204 receive an electron from the source and are reflected off the source as Ar neutrals 202b. If these Ar neutrals 202b strike the substrate 208 (or more particularly the thin film formed on the substrate by the target atoms 206 or previously deposited atoms) they increase the mobility of the atoms 206 (or other atoms) that are already deposited on the substrate 208. These Ar neutrals 202b can also induce structural defects (especially in the bulk of the thin film) reducing the electrical quality of the film. A high sputter pressure also increases the probability of collisions between Ar neutrals 202b and the rest of the Ar atoms in the chamber 200 reducing the kinetic energy, $E_k$(Ar), of Ar neutrals 202b and hence minimizing the defect density produced by Ar neutrals 202b in the deposited film.

Indeed, while increasing the mobility of the target atoms 206 located at the surface of the thin film deposited on the substrate 208 may be beneficial as this facilitates these surface atoms 206 finding their respective minimum energy positions and forming the desired crystal structure, the energy of the Ar neutrals 202b may be difficult to control and may have adverse consequences. More particularly, high energy neutrals 202b may also penetrate into the bulk of the deposited thin film knocking deposited atoms 206 from their equilibrium positions. As bulk diffusion of atoms is much slower than surface diffusion, these perturbed atoms 206 have a lower probability of diffusing back to their original equilibrium positions, and hence, defects may be formed in the deposited film.

In particular embodiments, the energies of the ejected target atoms 206 that strike the substrate 208 are intentionally reduced to obtain absorber or buffer layers with high electronic quality; that is, for example, having a high photovoltaic efficiency for absorbing sunlight and converting this solar irradiance into electrical free energy. In some particular described embodiments, reference to a sputtering atmosphere is made with reference to a sputtering atmosphere of Ar atoms for simplification. However, it should be appreciated that a wide variety of other sputtering gases may be additionally or alternately used in other embodiments including, by way of example and not by way of limitation, one or more of: helium (He), krypton (Kr), xenon (Xe), oxygen (e.g., in the form of dioxygen ($O_2$)), nitrogen (e.g., in the form of dinitrogen ($N_2$)), hydrogen (H), hydrogen sulfide ($H_2S$), hydrogen selenide ($H_2Se$), phosphorus trihydride ($PH_3$), ammonia ($NH_3$), and phosphorus pentoxide ($P_2O_5$), among others. As such, in the described embodiments, reference to the pressure of the sputtering atmosphere may be made with reference to the total sputtering pressure in the chamber, $p_{tot}$, rather than Ar sputtering pressure, $p_{Ar}$.

In particular embodiments, absorber and buffer layers suitable for use in, for example, each of the conversion layers 106, 126, 146, or 166, are sputtered with magnetron sputtering in the presence of one or more gases such as, by way of example and not by way of limitation, one or more inert gases (e.g., Ar, Kr, or Xe) and/or one or more reactive gases (e.g., $O_2$, $N_2$, $H_2S$, $H_2Se$, $PH_3$, $NH_3$, $P_2O_5$) at the same time or at different times. Generally, the electronic quality of the sputtered layers, and particularly the absorber and buffer layers, depends on: the discharge voltage; the total gas pressure in the chamber, $p_{tot}$; the amount of reactive gas in the sputtering chamber; the deposition rate (the deposition rate may be defined as the number of atoms that land on the substrate per second or the increase in the thickness of the deposited layer per second), DR; the distance from the source to the substrate, d; the applied bias voltage on the substrate, $V_{bias}$; and the substrate temperature, $T_{sub}$.

As described above, to obtain absorber and buffer layers with high electronic quality, the energies of the ejected target atoms 206 that strike the substrate are reduced. As illustrated in FIG. 2, the discharge voltage accelerates positive Ar ions 202a toward the source 204. Ar ions 202a that strike the source 204 may cause atoms 206 to be ejected from the source 204. Atoms 206 ejected from the source 204 may then deposit on substrate 208. When the discharge voltage is large, the energies of the positive Ar ions 202a is larger resulting in larger kinetic energy ($E_k$(Ar)) of Ar neutrals 202b and kinetic energy ($E_k$(atoms)) of ejected target atoms 206. In particular embodiments, the kinetic energy ($E_k$(atoms)) of the atoms 206 that strike the substrate 208 is reduced by reducing the discharge voltage. In particular embodiments, a lower discharge voltage may be achieved by exciting the plasma during the sputtering process with radio frequency (RF) or current pulse power supplies. Additionally, as sputtering in the presence of a reactive gas can increase the discharge voltage, in particularly embodiments, the discharge voltage is further reduced by sputtering in a sputtering atmosphere that includes a combination of reactive and inert gases.

The present inventors have also determined that absorber and buffer layers with high electronic quality can be obtained with a DC power supply if the total sputtering pressure, $p_{tot}$, is sufficiently large. In general, a higher total pressure, $p_{tot}$, in the sputtering chamber 200 increases the probability of collision between atoms, and particularly between: 1) ejected target atoms 206, and 2) Ar neutrals 202b and Ar ions 202a in the chamber 200. The increase in collision probability reduces the energy of the ejected target atoms 206 and reflected Ar neutrals 202b that strike the substrate 208 (or the thin film formed on the substrate by target atoms 206, previously deposited atoms, or reactive gas atoms). The amount of reactive gas in the sputtering chamber 200 (where the amount of reactive gas represents the number of molecules of reactive gas in the chamber) also affects the energies of the ejected target atoms 206 as the amount of reactive gas in the chamber 200 determines, at least in part, the probability of reaction between the ejected target atoms 206 and the atoms of the reactive gas. Thus, in particular embodiments, the amount of reactive gas is increased (therefore increasing $p_{tot}$) resulting in a reduction of the energies of the ejected target atoms 206.

In particular embodiments, the deposition rate (DR) of the ejected target atoms 206 is increased as the total sputtering pressure, $p_{tot}$, increases to maintain the same surface mobility of atoms 206 deposited on the substrate 208. Additionally, the amount of reactive gas in the sputtering chamber 200 must also increase (if applicable) to maintain the same composition in the sputtered films (layers).

In particular embodiments, the source-to-substrate distance, d, is increased to increase the probability of collisions between ejected target atoms 206 and Ar neutrals 202b with Ar ions 202a. Therefore, increasing the source-to-substrate distance, d, reduces the total sputter pressure, $p_{tot}$, required to maintain the electronic quality of the deposited layer.

In particular embodiments, the bias voltage, $V_{bias}$, may be adjusted to vary the mobility of the target atoms 206 deposited on the substrate 208. In particular embodiments, the bias voltage, $V_{bias}$, is a negative voltage applied to the substrate 208 with respect to, for example, the walls of the sputtering chamber 200. The bias voltage increases the mobility of the deposited atoms 206 on the substrate surface 210. A high mobility of atoms 206 in the deposited film is desired for obtaining absorber and buffer layers having high electronic qualities. The role of the bias voltage is to accelerates positive ions toward the substrate 208. These positive ions strike the deposited thin film increasing the defect density in the deposited film.

In particular embodiments, the deposited layers may also be heated, such as by heating the substrate 208, to increase the mobility of the deposited atoms 206. Increasing the substrate temperature, $T_{sub}$, increases mobility and can improve crystal structure and increase grain size in the deposited film. This can reduce defect densities and improve the electronic qualities of absorber and buffer layers. The substrate temperature, $T_{sub}$, is also an important parameter in the formation of a desired chalcopyrite structure in CuIn-based solar cells.

In general, the total sputtering gas pressure, $p_{tot}$, in the chamber should be greater than approximately 0.4 Pascals (Pa) (~3 mTorr) and the substrate temperature, $T_{sub}$, should be higher than approximately 300 degrees Celsius. However, in particular embodiments, if the source-to-substrate distance, d, is less than 3 cm, then the total gas pressure, $p_{tot}$, in the chamber is increased to at least 0.25 Pa (~2 mTorr), and the substrate temperature, $T_{sub}$, is increased to at least 300 C. Additionally, in particular embodiments, if the deposition rate, DR, is greater than 5 nm/s, then the total gas pressure, $p_{tot}$, in the chamber is at least 0.25 Pa (~2 mTorr), and the substrate temperature, $T_{sub}$, is increased to at least 300 degrees Celsius. However, in even more preferred embodiments, it is even more desirable to use the parameters outlined in FIG. 3, which shows a table that includes example sets of parameters for sputtering absorber layers at elevated temperatures (e.g., above 300 degrees Celsius). More particularly, each row of the table of FIG. 3 corresponds to a set of parameters for use during sputtering of an absorber layer. In particular embodiments, as is the case for each set of parameters of FIG. 3, the total sputtering gas pressure, $p_{tot}$, in the chamber is greater than approximately 0.5 Pascals (Pa) (~4 mTorr) and the substrate temperature, $T_{sub}$, is higher than approximately 300 degrees Celsius. In particular embodiments, if the source-to-substrate distance, d, is less than 3 cm, then the total gas pressure, $p_{tot}$, in the chamber is increased to at least 0.9 Pa (7 mTorr), and the substrate temperature, $T_{sub}$), is increased to at least 300 C. In particular embodiments, if the deposition rate, DR, is greater than 5 nm/s, then the total gas pressure, $p_{tot}$, in the chamber is at least 0.7 Pa (5 mTorr), and the substrate temperature, $T_{sub}$), is increased to at least 300 degrees Celsius. In particular embodiments, if the source-to-substrate distance, d, is less than approximately 3 cm, and if the deposition rate, DR, is greater than approximately 5 nm/s, then the total gas pressure, $p_{tot}$, in the chamber increased to at least 1.3 Pa (10 mTorr) and the substrate temperature, $T_{sub}$), is increased to at least 300 degrees Celsius. Additionally, in particular embodiments, if the source-to-substrate distance, d, is less than approximately 3 cm, and if the deposition rate, DR, is greater than approximately 5 nm/s, and if the applied bias voltage, $V_{bias}$, on the substrate is less than approximately −300 Volts (the "−" minus indicates that the bias is negative with respect to the sputtering chamber walls, hence, "less than approximately −300 Volts" refers to a negative bias voltage having a magnitude larger than 300 (e.g., −350 Volts)), then the total gas pressure, $p_{tot}$, in the chamber is greater than 2 Pa (16 mTorr) and the substrate temperature, $T_{sub}$), is higher than 300 degrees Celsius.

In particular embodiments, similar parameters may be used for sputtering the buffer layers. However, when sputtering buffer layers, the substrate temperature, $T_{sub}$), may be lower than for sputtering the absorber layers, and is chosen to ensure that no undesired diffusion/intermixing occurs.

Figure 4:
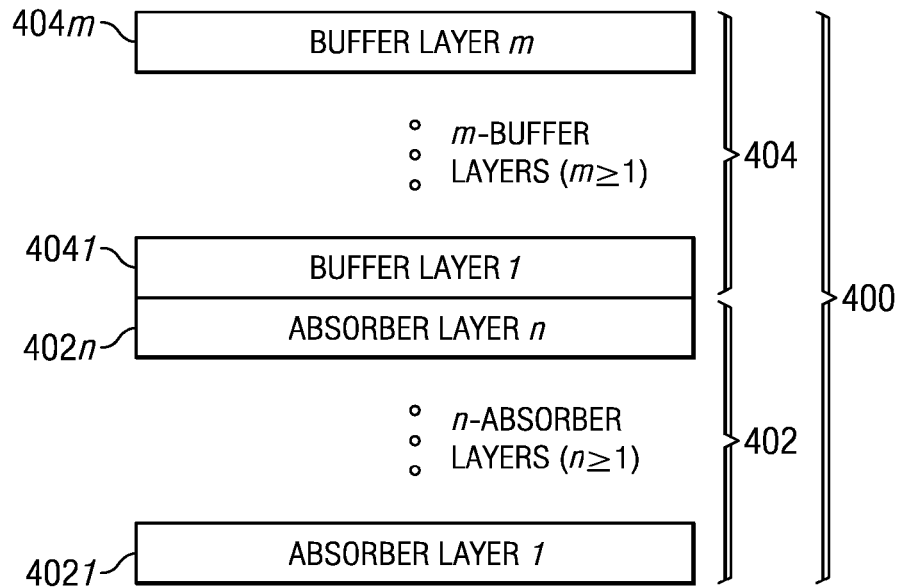
FIG. 4 illustrates an example conversion layer.

As described above, each of the conversion layers 106, 126, 146, and 166 are comprised of at least one or more absorber layers and one or more buffer layers of opposite doping. FIG. 4 illustrates an example conversion layer 400 that is comprised of an overlying sequence of n adjacent absorber layers (where n is the number of adjacent absorber layers and where n is greater than or equal to 1) 402l to 402n (collectively forming absorber layer 402), adjacent to m adjacent buffer layers (where m is the number of adjacent buffer layers and where m is greater than or equal to 1) 404l to 404m (collectively forming buffer layer 404). In particular embodiments, at least one of the absorber layers 402l to 402n is sputtered in the presence of a sputtering atmosphere that includes at least one of H₂S and H₂Se. Although FIG. 4 illustrates the buffer layers 404 as being formed over the absorber layers 402 (relative to the substrate), it alternate embodiments, the absorber layers 402 may be positioned over the buffer layers 404.

In particular embodiments, each of the absorber layers 402l to 402n are deposited using magnetron sputtering. Additionally, in particular embodiments, at least one of the absorber layers 402l to 402n is deposited on a substrate (e.g., substrate 208 generally, and more particularly, one of substrates 102, 122, 142, or 162) that has been previously heated to a substrate temperature, $T_{sub}$), greater than approximately 300 degrees Celsius. In particular embodiments, to obtain the desired crystal structure, CuIn-containing absorber layers 402 are heated (via heating the substrate) to a temperature above 300 degrees Celsius. In one particular embodiment, CuIn-containing absorber layers 402 are formed by sputtering (via magnetron sputtering) CuIn-containing layers at temperatures below 300 degrees Celsius followed by post-sputter annealing of these layers at temperatures above 300 degrees Celsius. In such an embodiment, the composition profile across the absorber layers 402 is difficult to control as the composition profile across the absorber layers may change after annealing. However, by annealing the absorber layers 402 in very short time scales composition profile changes across the absorber layers may be inhibited or prevented. In another particular embodiment, the absorber layers 402 are sputtered (e.g., with magnetron sputtering) on a substrate (e.g., substrate 102, 122, 142, or 162) that has been previously heated to temperatures above 300 degrees Celsius. In this embodiment, the desired crystal structure may be produced during the sputtering of the absorber layers 402. This embodiment also enables much more precise control of the composition profile across the absorber layers 402. Controlling the composition profile across the absorber layers 402 is important for maximizing the efficiency of the conversion of solar irradiance into electrical free energy.

In particular embodiments, $CuIn(S,Se)_2$ absorber layers 402 may be formed by sputtering (e.g., magnetron sputtering) compound source materials at temperatures above 300 degrees Celsius. By way of example, a $CuIn(S,Se)_2$ absorber layer may be formed using a target source that comprises $CuIn(S,Se)_2$. As another example, $In_2(S,Se)_3$ and $Cu(S,Se)$ absorber layers 402 may be formed using target sources that comprise $In_2(S,Se)_3$ and $Cu(S,Se)$. In such embodiments, the S and/or Se quantities necessary for the formation of chalcogenides are supplied directly from the sputter target sources. However, both S and Se can easily evaporate during the sputtering process resulting in S and Se deficient $CuIn(S,Se)_2$ absorber layers that have less than desired conversation efficiency. In particular embodiments, to mitigate this problem, at least one of the absorber layers 402l to 402n is sputtered (e.g., using one of the aforementioned targets) in a sputtering atmosphere that includes at least one reactive gas, and particularly, $H_2S$ or $H_2Se$. These gases provide a virtually unlimited supply of S and Se and hence, maintain the total S and Se content in the deposited layers above, for example, 48 atomic percent and improving the light conversion efficiency of such $CuIn(S,Se)_2$ absorber layers.

In alternate embodiments, solar cells with a high quality $CuInS_2$ absorber layer can be obtained by sputtering elemental target sources (e.g., Cu or In) in the presence of a sputtering atmosphere of $H_2S$ or $H_2Se$. However, in particular embodiments, at least one compound source is used for forming absorber or buffer layers of CuIn-based solar cells. As such, in particular embodiments, target sources used in depositing CuIn-based absorber layers 302 may contain Cu and In and at least at least one of: B, C, N, Na, Al, Si, P, S, K, Ti, V, Cr, Mn, Fe, Co, Ni, Cu, Zn, Ga, Ge, Se, Rb, Zr, Nb, Mo, Ru, Rh, Pd, Ag, Cs, Hf, Ta, W, Re, Ir, Pt, Au, Hg, Pb, Bi, and Cd.

Figure 5:
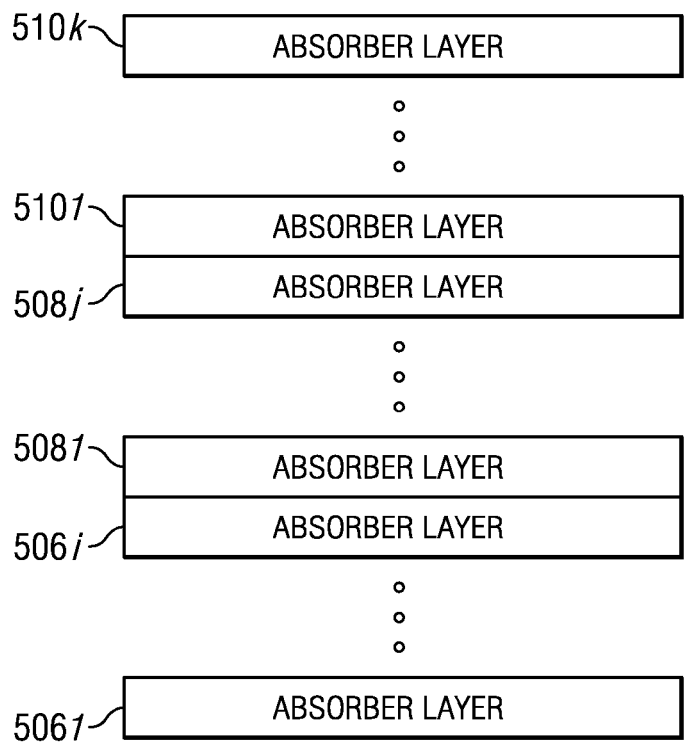
FIG. 5 illustrates an example absorber layer.

FIG. 5 illustrates, more* particularly, an absorber layer 402 that is comprised of an overlying sequence of i absorber layers 506 (where i is the number of absorber layers of type 506 and where i is greater than or equal to 1 and less than or equal to 100) 506l to 506i, j absorber layers 508 (where j is the number of absorber layers of type 508 and where j is greater than or equal to 0 and less than or equal to 100) 508l to 508j, and k absorber layers 510 (where k is the number of absorber layers of type 510 and where k is greater than or equal to 0 and less than or equal to 100) 510l to 510k. Thus, the total number of absorber layers in this embodiment is n, where n=i+j+k. In one particular embodiment, each of the absorber layers 506l to 506i, 508l to 508j, and 510l to 510k is sputter deposited from the respective sputter source materials shown in Table 2 illustrated in FIGS. 6A and 6B, which illustrate top and bottom portions, respectively, of this table. In particular embodiments, at least one of these layers is sputtered at a temperature above 300 degrees Celsius. As described above, one or more of these layers may also be sputtered in the presence of one or both of $H_2S$ and $H_2Se$ to avoid S and Se deficiency in the resultant absorber films.

In another embodiment, each of the absorber layers 506l to 506i, 508l to 508j, and 510l to 510k is sputter deposited from the respective sputter source materials shown in Table 2 illustrated in FIGS. 6A and 6B at temperatures below 300 degrees Celsius. Subsequently these absorber layers are annealed at temperatures above 350 degrees Celsius. However, in even more preferred embodiments, the annealing is performed at temperatures above 500 degrees Celsius. As described above, one or more of these layers may also be sputtered and annealed in the presence of one or both of $H_2S$ and $H_2Se$ to avoid S and Se deficiency in the resultant absorber films.

FIG. 7 illustrates Table 3, which shows example sputter source materials and parameters suitable for use in forming buffer layers 404l to 404m. Buffer layers 404l to 404m may be formed using sputtering, and particularly magnetron sputtering, as described above, or, alternately, using chemical bath deposition, chemical vapor deposition, atomic layer deposition, or another suitable process. In particular embodiments, one or more of buffer layers 404l to 404m individually or collectively contain at least one of: Al, Zn, Ga, Cd, In, or Sn and at least one of: S, Se, or Te. By way of example, one or more of buffer layers 404l to 404m may be a Si or Ge layer doped with at least one of: N, P, As, Sn, B, Al, Ga, or In.

Figure 8:
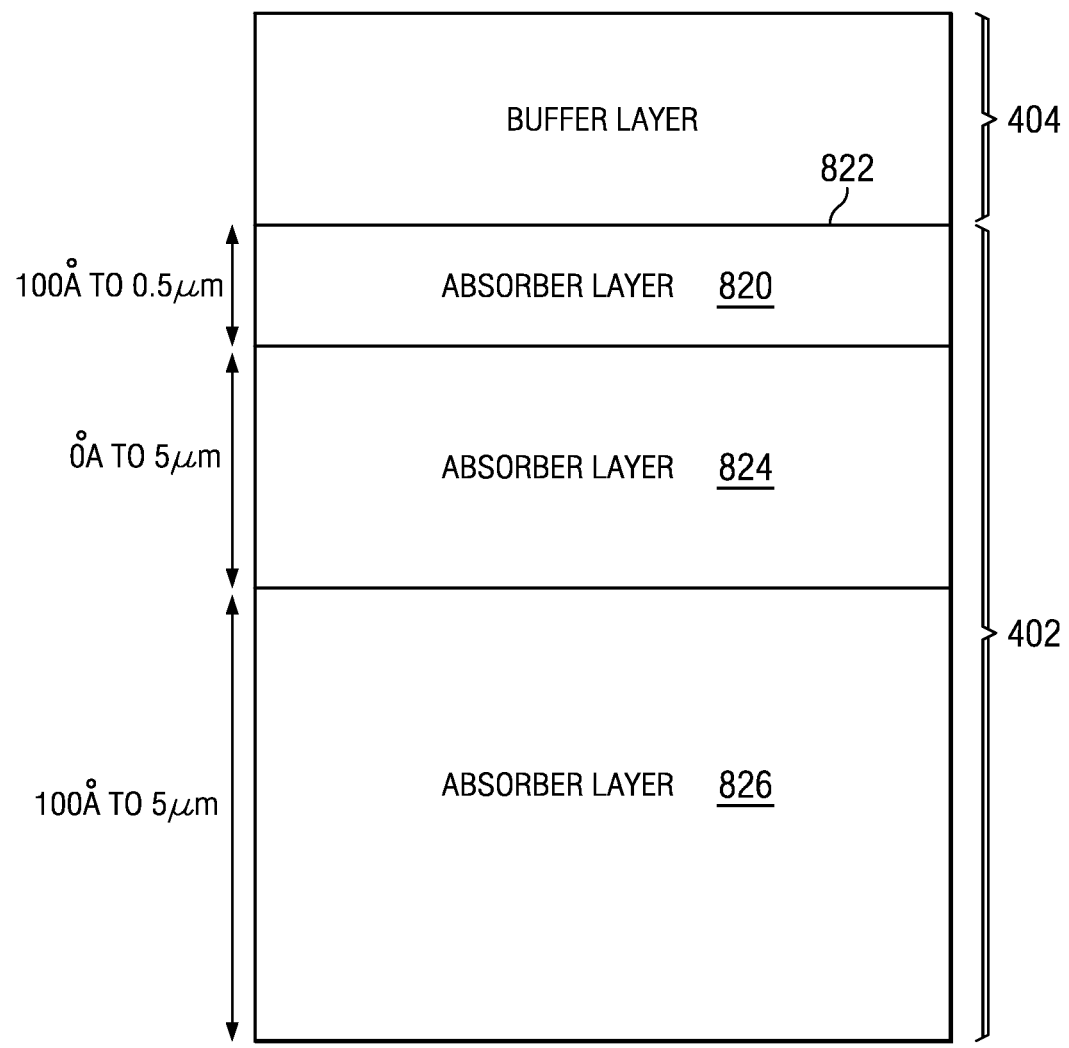
FIG. 8 illustrates an example interface region between an absorber layer and a buffer layer.

In particular embodiments, to obtain high efficiency solar cells, the Cu content in the absorber layer 402 in the region 820 (illustrated in FIG. 8) proximal to the interface 822 between the absorber layer 402 and buffer layer 404 is less than approximately 30 atomic percent (at. %). In particular embodiments, the thickness of interface region 820 is in the range of approximately 100 Å (Angstroms) to 0.5 μm (microns).

Figure 9A:
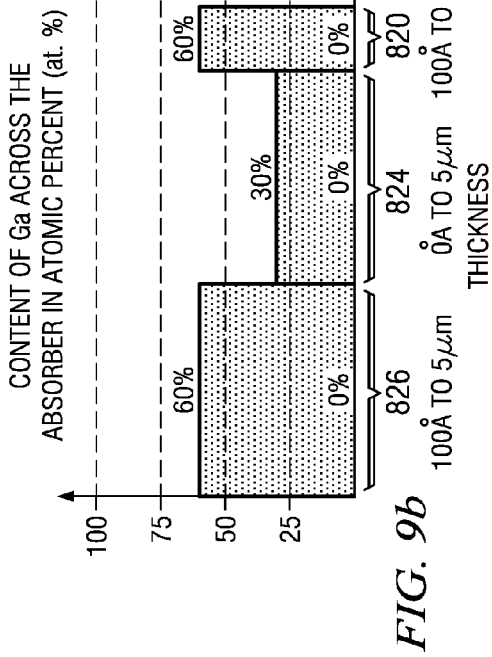
FIGS. 9A-9H show example absorber layer composition profiles.
Figure 9B:
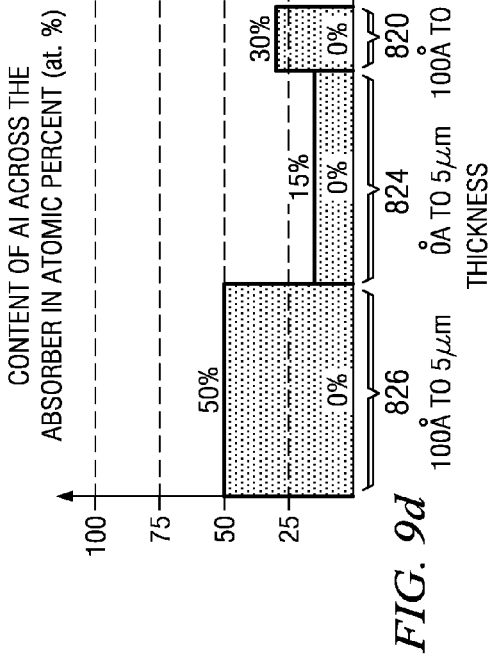
Figure 9C:
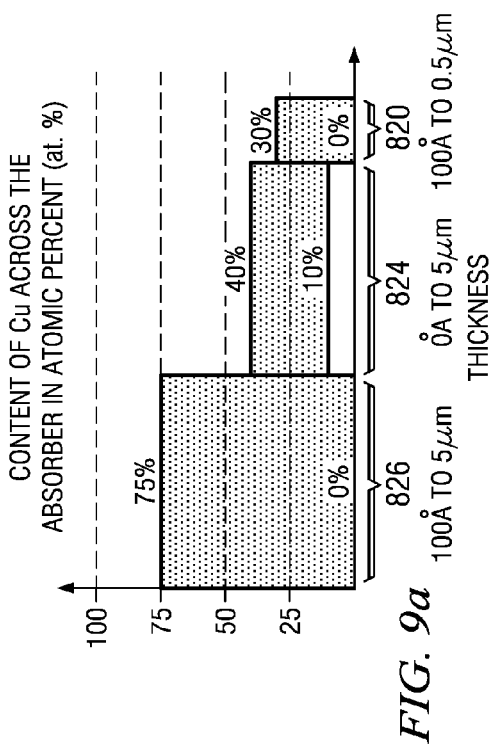
Figure 9D:
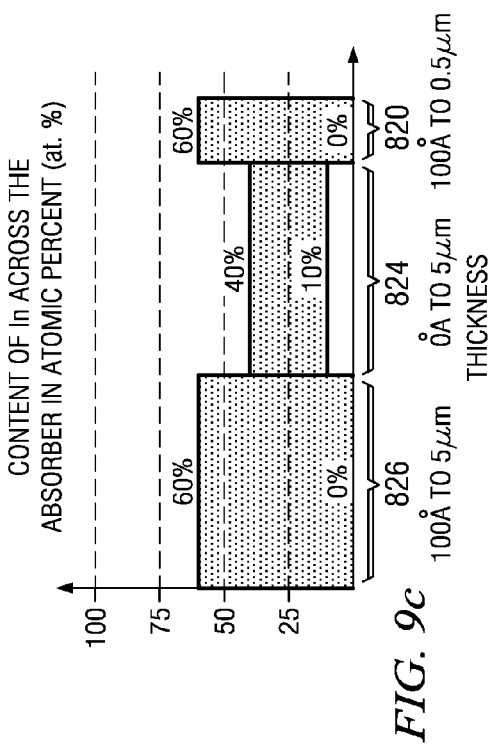
Figure 9E:
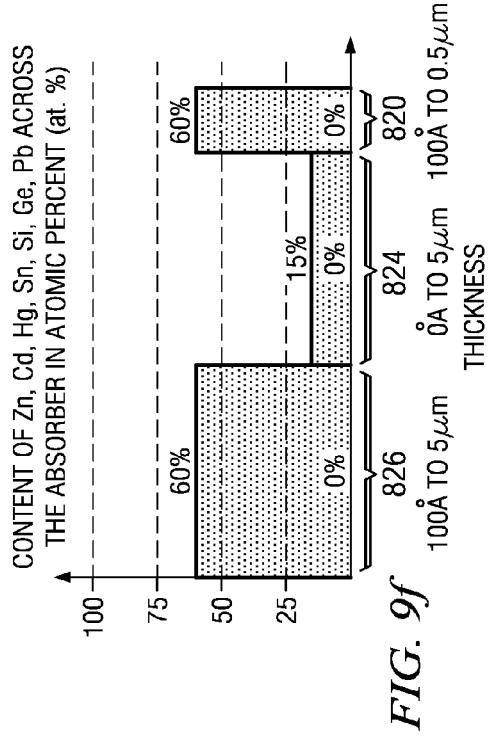
Figure 9F:
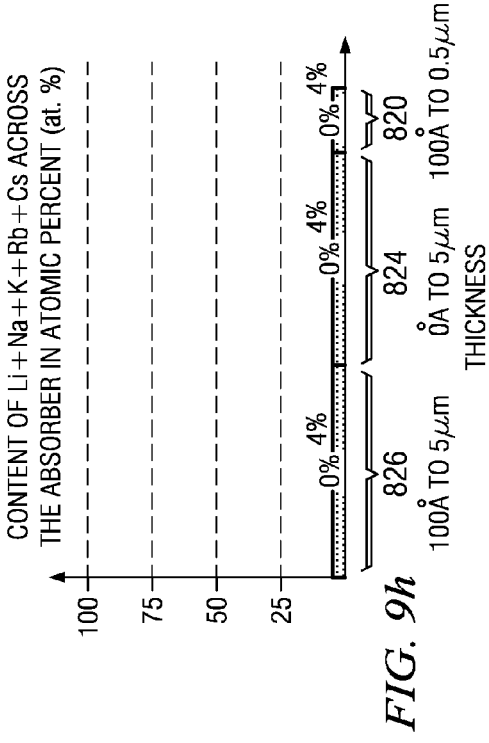
Figure 9G:
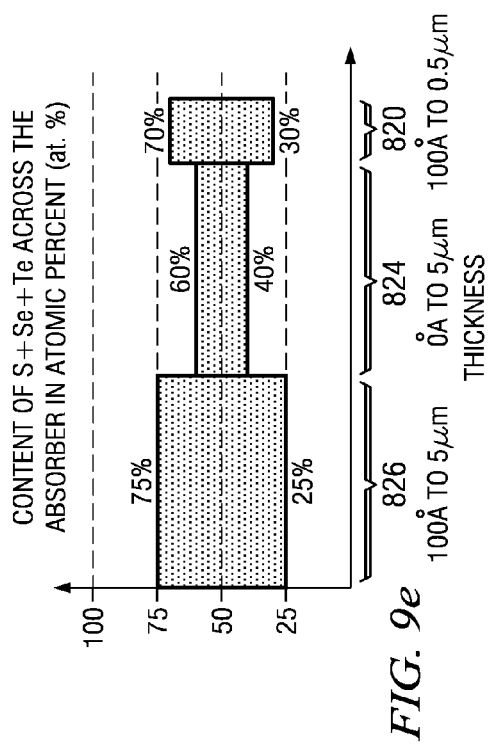
Figure 9H:
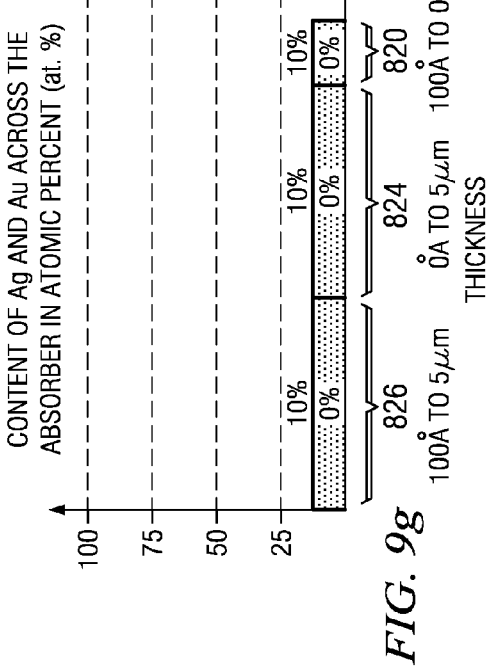

FIGS. 9A-9H show example composition profiles for absorber layers in accordance with particular embodiments obtained using sputter deposition where at least one of the layers is heated above 300 degrees Celsius during its deposition. More particularly, FIG. 9A illustrates a composition profile of an absorber layer 402 where the vertical axis represents the atomic percent of Cu. The horizontal axis indicates the thickness of particular regions (regions 820, 824, and 826 from FIG. 8) of the absorber layer 402 for which the atomic percent composition is specified. Absorber layer region 820 is the region of the absorber 402 closest to the buffer layer 404, absorber layer region 824 is a middle region of the absorber, and absorber layer region 826 is the region of the absorber closer to the back contact. More particularly, region 820, the interface region, refers to the region that neighbors interface 822 and, in particular embodiments, has a thickness in the range of approximately 100 Å (Angstroms) to 0.5 μm. Region 824 borders region 820 and, in particular embodiments, has a thickness in the range of approximately 0 Å to 5 μm. Region 826 borders region 824 and, in particular embodiments, has a thickness in the range of approximately 100 Å to 5 μm. FIG. 9B illustrates a composition profile of an absorber layer 402 where the vertical axis represents the atomic percent of Ga with respect to particular regions of the absorber layer 402. FIG. 9C illustrate a composition profile of an absorber layer 402 where the vertical axis represents the atomic percent of In with respect to particular regions of the absorber layer 402. FIG. 9D illustrates a composition profile of an absorber layer 402 where the vertical axis represents the atomic percent of Al with respect to particular regions of the absorber layer 402. FIG. 9E illustrates a composition profile of an absorber layer 402 where the vertical axis represents the atomic percent of the combined total of S, Se, and Te with respect to particular regions of the absorber layer 402. FIG. 9F illustrates a composition profile of an absorber layer 402 where the vertical axis represents the atomic percent of the combined total of Zn, Cd, Hg, Sn, Si, Ge, and Pb with respect to particular regions of the absorber layer 402. FIG. 9G illustrates a composition profile of an absorber layer 402 where the vertical axis represents the atomic percent of the combined total of Ag and Au with respect to particular regions of the absorber layer 402. Lastly, FIG. 9H illustrates a composition profile of an absorber layer 402 where the vertical axis represents the atomic percent of the combined total of Li, Na, K, Rb, and Cs with respect to particular regions of the absorber layer 402.

Figure 10B:
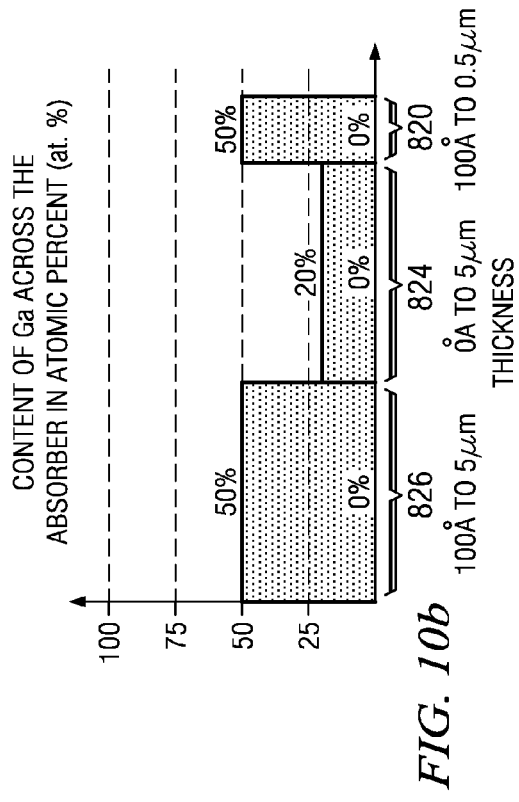
FIGS. 10A-10H show example absorber layer composition profiles.
Figure 10D:
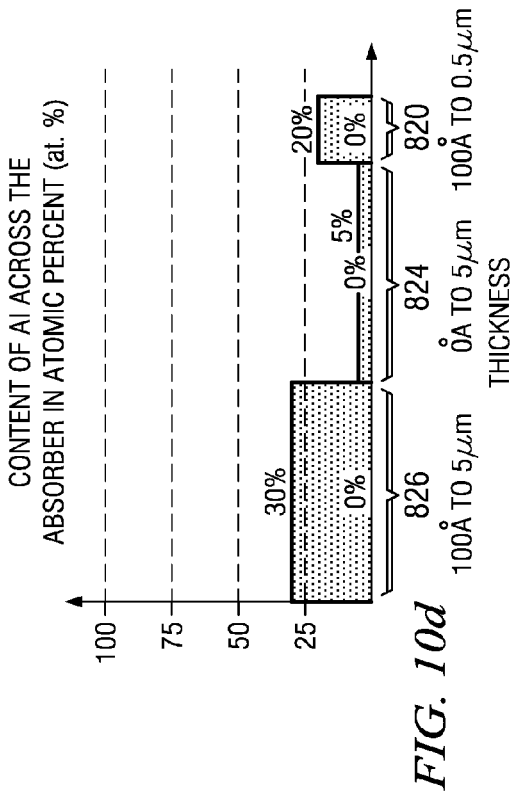
Figure 10A:
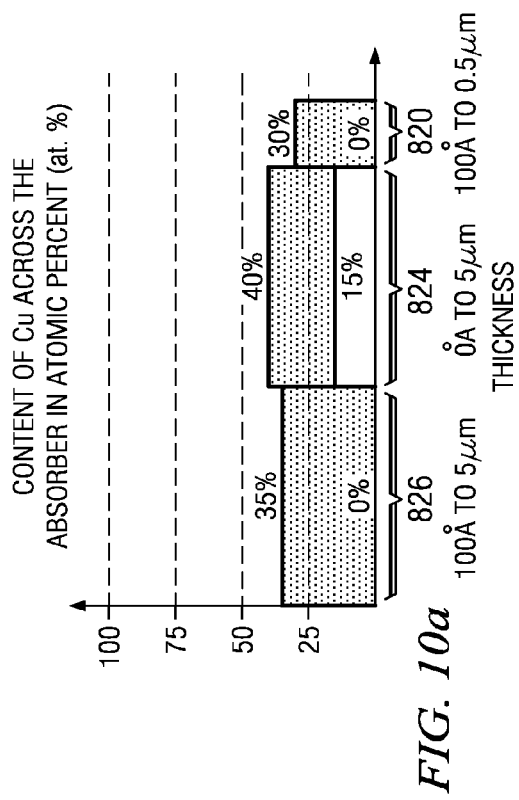
Figure 10C:
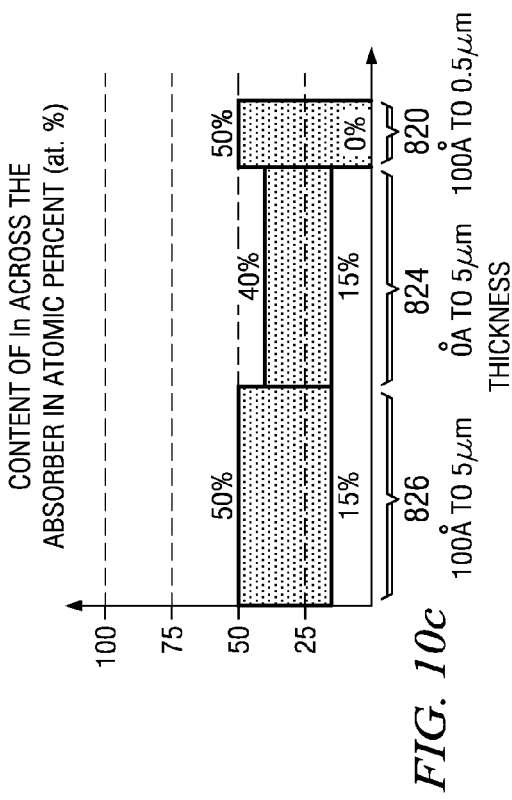
Figure 10F:
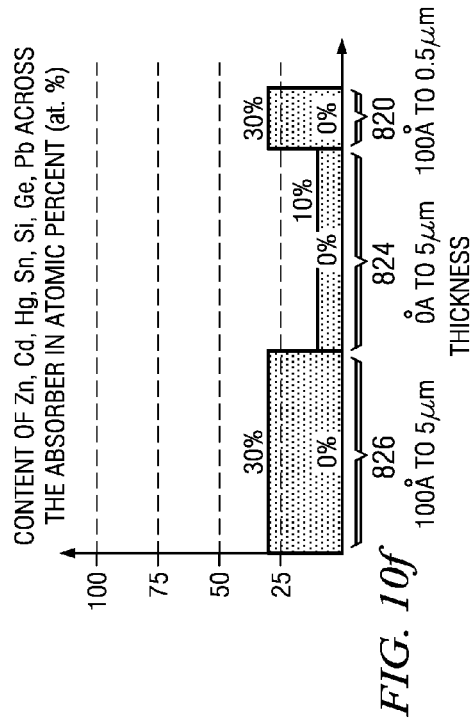
Figure 10H:
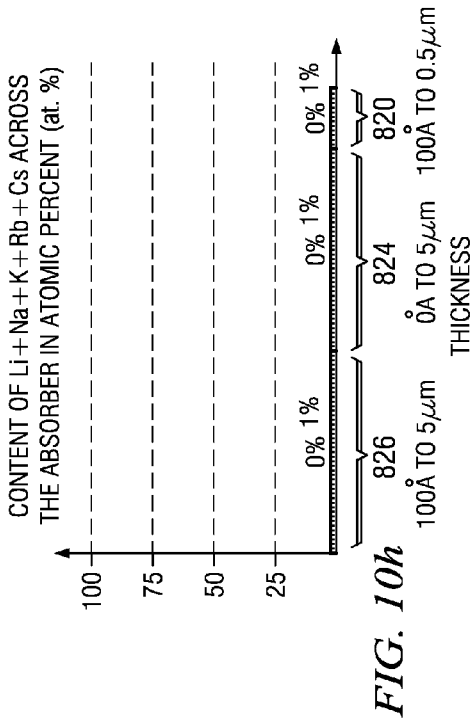
Figure 10E:
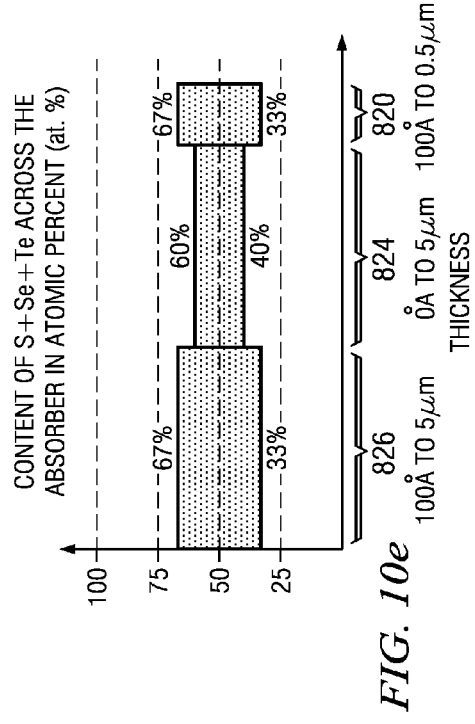
Figure 10G:
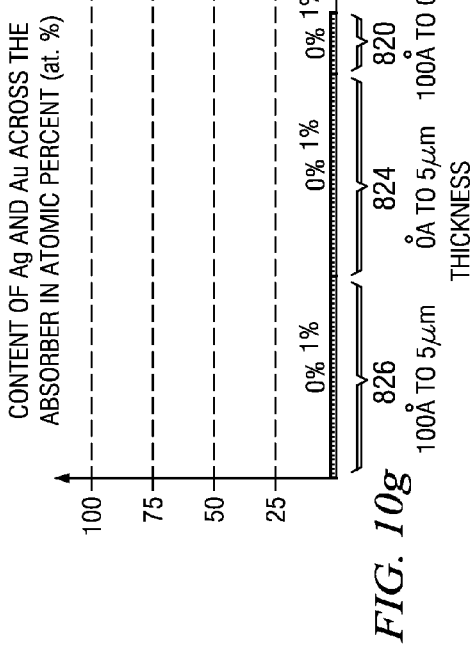

FIGS. 10A-10H show more preferable examples of absorber layer composition profiles in accordance with more particular embodiments obtained using sputter deposition where at least one of the layers is heated above 300 degrees Celsius during the deposition. More particularly, FIG. 10A illustrates a composition profile of an absorber layer 402 where the vertical axis represents the atomic percent of Cu. The horizontal axis again indicates the thickness of particular regions (regions 820, 824, and 826 from FIG. 8) of the absorber layer 402 for which the atomic percent composition is specified. FIG. 10B illustrates a composition profile of an absorber layer 402 where the vertical axis represents the atomic percent of Ga with respect to particular regions of the absorber layer 402. FIG. 10C illustrate a composition profile of an absorber layer 402 where the vertical axis represents the atomic percent of In with respect to particular regions of the absorber layer 402. FIG. 10D illustrates a composition profile of an absorber layer 402 where the vertical axis represents the atomic percent of Al with respect to particular regions of the absorber layer 402. FIG. 10E illustrates a composition profile of an absorber layer 402 where the vertical axis represents the atomic percent of the combined total of S, Se, and Te with respect to particular regions of the absorber layer 402. FIG. 10F illustrates a composition profile of an absorber layer 402 where the vertical axis represents the atomic percent of the combined total of Zn, Cd, Hg, Sn, Si, Ge, and Pb with respect to particular regions of the absorber layer 402. FIG. 10G illustrates a composition profile of an absorber layer 402 where the vertical axis represents the atomic percent of the combined total of Ag and Au with respect to particular regions of the absorber layer 402. Lastly, FIG. 10H illustrates a composition profile of an absorber layer 402 where the vertical axis represents the atomic percent of the combined total of Li, Na, K, Rb, and Cs with respect to particular regions of the absorber layer 402.

In particular embodiments, the afore-described methods are used to fabricate CIGS-based solar cells that are comprised of an overlaying sequence of (beginning with the layer closest to the substrate) a Mo conductive layer, a Cu(In,Ga)Se$_2$ absorber layer, a CdS buffer layer, a ZnO conductive layer, and a ZnO conductive layer doped with Al$_2$O$_3$. In particular embodiments, to maximize the efficiency of this multi-layer structure cell, the Ga content across the Cu(In,Ga)Se$_2$ absorber is intentionally non-uniform, that is, the Ga content at the Mo and CdS interfaces is greater than in the middle of the Cu(In,Ga)Se$_2$ absorber layer. This composition profile is very difficult to obtain using a post-sputter annealing process. For example, the Cu(In,Ga)Se$_2$ absorber layer can be obtained by annealing a multilayer-structure comprised of a CuGa layer, a In layer, and a Se layer that are sputter deposited on top of the Mo layer. In such an embodiment, the Ga content is greatest at the interface between the Mo and Cu(In,Ga)Se$_2$ layers and monotonically decreases toward the Cu(In,Ga)Se$_2$ interface with the buffer layer, which is not desirable for absorbers used in high efficiency solar cells. Thus, in particular embodiments, to obtain an optimal composition profile across the absorber layer, at least one of the absorber layers 402$l$ to 402$n$ is deposited by sputtering at a temperature above 300 degrees Celsius. The desired Ga composition profile can be also obtained by fast annealing process. In this case Ga and In do not have time to diffuse across the absorber leading to decrease of Ga concentration at the interface with buffer layer.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

What is claimed is:

1. A photovoltaic cell comprising:
   a conversion layer comprising:
      one or more semiconducting absorber layers each having a first doping type, wherein one or more of the semiconducting absorber layers comprises at least one chalcogenide material comprising copper (Cu), one or more of indium (In) or gallium (Ga) and one or more of sulfur (S), selenium (Se), or tellurium (Te), wherein the combined content of S, Se, and Te in the one or more semiconducting absorber layers is greater than or equal to approximately 48 atomic percent and less than or equal to approximately 56 atomic percent across the one or more semiconducting absorber layers; and
      one or more semiconducting buffer layers each having a second doping type opposite that of the first doping type, wherein the one or more semiconducting buffer layers are collectively positioned immediately adjacent to the one or more semiconducting absorber layers forming an interface between the one or more semiconducting buffer layers and the one or more semiconducting absorber layers, wherein the Cu content in an interface region of the one or more semiconducting absorber layers immediately adjacent the interface is less than or equal to approximately 25 atomic percent and varies across the one or more semiconducting absorber layers immediately adjacent the interface, and
   wherein the Ga content in the interface region of the one or more semiconducting absorber layers immediately adjacent the interface is greater than in the middle of the one or more semiconducting absorber layers immediately adjacent the interface.

2. The photovoltaic cell of claim 1, wherein the first doping type is n-type doping and wherein the second doping type is p-type doping.

3. The photovoltaic cell of claim 1, wherein the first doping type is p-type doping and wherein the second doping type is n-type doping.

4. The photovoltaic cell of claim 1, wherein the at least one chalcogenide material further comprises;
   one or more of gallium (Ga), zinc (Zn), aluminum (Al), or cadmium (Cd), and wherein the combined content of Ga, Zn, Al, and Cd in the interface region of the one or more semiconducting absorber layers is greater than or equal to 5 atomic percent.

5. The photovoltaic cell of claim 1, wherein one or more of the semiconducting buffer layers comprises:
   at least one chalcogenide material comprising one or more of sulfur (S), selenium (Se), or tellurium (Te).

6. The photovoltaic cell of claim 5, wherein the at least one chalcogenide material of the semiconducting buffer layers further comprises:
   at least one or more of aluminum (Al), zinc (Zn), gallium (Ga), cadmium (Cd), indium (In), or tin (Sn).

7. The photovoltaic cell of claim 1, further comprising: a substrate over which the conversion layer is deposited.

8. The photovoltaic cell of claim 7, further comprising: a first conductive layer positioned between the substrate and the conversion layer.

9. The photovoltaic cell of claim 8, further comprising: a second conductive layer deposited over the conversion layer.

10. The photovoltaic cell of claim 9, wherein the substrate is a transparent glass substrate; the first conductive layer is a first transparent conductive layer; and the second conductive layer is a second transparent conductive layer.

11. The photovoltaic cell of claim 1, wherein the at least one chalcogenide material further comprises indium (In) and wherein the combined content of Cu and In in the one or more semiconducting absorber layers is greater than or equal to approximately 22 atomic percent and less than or equal to 52 atomic percent.

12. The photovoltaic cell of claim 11, wherein a variation of the combined content of Cu, Ga and In in the one or more semiconducting absorber layers is less than approximately 4 atomic percent across the one or more semiconducting absorber layers.

13. The photovoltaic cell of claim 11, wherein a variation of the content of Cu in the one or more semiconducting absorber layers is at least approximately 4 atomic percent across the one or more semiconducting absorber layers.

14. The photovoltaic cell of claim 11, wherein a variation of the content of Cu in the one or more semiconducting absorber layers is at least approximately 4 atomic percent across the one or more semiconducting absorber layers and the variation of the combined content of Cu, Ga and In in the one or more semiconducting absorber layers is less than 4 atomic percent across the one or more semiconducting absorber layers.

15. A photovoltaic cell comprising:
   a glass substrate;
   a first transparent conductive layer arranged over the glass substrate;
   a conversion layer arranged over the first transparent conductive layer; and
   a second transparent conductive layer arranged over the conversion layer, wherein the conversion layer comprises:
      one or more semiconducting absorber layers each having p-type doping, wherein the one or more of the semiconducting absorber layers comprises at least one first chalcogenide material comprising:
         copper (Cu);
         one or more of indium (In) or gallium (Ga); and
         one or more of sulfur (S), selenium (Se), or tellurium (Te), wherein the combined content of S, Se, and Te in the one or more semiconducting absorber layers is greater than or equal to approximately 48 atomic percent and less than or equal to approximately 56 atomic percent across the one or more semiconducting absorber layers; and
   one or more semiconducting buffer layers each having n-type doping, wherein
   one or more of the semiconducting buffer layers comprises:
      at least one second chalcogenide material comprising:
         one or more of sulfur (S), selenium (Se), or tellurium (Te) and; one or more of aluminum (Al), zinc (Zn), gallium (Ga), cadmium (Cd), indium (In), or tin (Sn),
      wherein the one or more semiconducting buffer layers are collectively positioned immediately adjacent to the one or more semiconducting absorber layers forming an interface between the one or more semiconducting buffer layers and the one or more semiconducting absorber layers, wherein the Cu content in an interface region of the one or more absorber layers immediately adjacent the interface is less than or equal to approximately 25 atomic percent, and varies across the one or more semiconducting absorber layers, percent, and wherein the Ga content in the interface region of the one or more semiconducting absorber layers immediately adjacent the interface is greater than in the middle of the one or more semiconducting absorber layers immediately adjacent the interface.

16. The photovoltaic cell of claim 15, wherein a variation of the content of Cu in the one or more semiconducting absorber layers is at least approximately 4 atomic percent across the one or more semiconducting absorber layers and the variation of the combined content of Ga and In in the one or more semiconducting absorber layers is less than 4 atomic percent across the one or more semiconducting absorber layers.

* * * * *